US006397741B1

(12) United States Patent
Curtin

(10) Patent No.: US 6,397,741 B1
(45) Date of Patent: Jun. 4, 2002

(54) SQUEEGEE HOLDER WITH ELECTRONIC MEASURING APPARATUS

(76) Inventor: Mark Curtin, 20 Westgate Plz., Apt. T5, Woburn, MA (US) 01801

( * ) Notice: Subject to any disclaimer, the term of this patent is extended or adjusted under 35 U.S.C. 154(b) by 0 days.

(21) Appl. No.: 09/572,106

(22) Filed: May 17, 2000

Related U.S. Application Data

(60) Provisional application No. 60/135,010, filed on May 20, 1999.

(51) Int. Cl.[7] .......................... B41F 15/46; B41F 15/42; B41F 15/44
(52) U.S. Cl. ....................................... 101/114; 101/123
(58) Field of Search .............................. 101/114, 115, 101/123, 129

(56) References Cited

U.S. PATENT DOCUMENTS

| | | | | |
|---|---|---|---|---|
| 4,433,623 A | * | 2/1984 | Beckim ........................ | 101/123 |
| 4,485,736 A | * | 12/1984 | Strutz et al. ................. | 101/123 |
| 5,632,200 A | * | 5/1997 | Fukai .......................... | 101/114 |
| 5,893,325 A | * | 4/1999 | Sakai .......................... | 101/123 |

FOREIGN PATENT DOCUMENTS

JP      01212492 A   *  8/1989   ............ H05K/3/34

* cited by examiner

*Primary Examiner*—Daniel J. Colilla
(74) *Attorney, Agent, or Firm*—Samuels, Gauthier & Stevens

(57) ABSTRACT

A squeegee blade system having a pair of squeegee blade holders, each holder having a squeegee blade secured thereto. When one squeegee blade moves to and from a print stroke position, the other holder moves its associated blade from and to a non-print stroke position. Each of the squeegee blade holders have an actuator and a sensor/display such that the actuator of one holder communicates with the sensor of the other holder. Each time one squeegee blade holder is moved to the print stroke position the actuator of the one squeegee blade holder actuates the sensor/display in the other squeegee blade holder such that an accurate count of the squeegee blade usage is displayed. In another embodiment, a squeegee blade system on a squeegee head has a pair of mirror image squeegee blades secured thereto such that the head moves to and from a stencil. A sensor and a means for counting are secured to the squeegee head such that the sensor is actuated each time the squeegee head moves to the stencil.

19 Claims, 1 Drawing Sheet

SQUEEGEE HOLDER WITH ELECTRONIC MEASURING APPARATUS

CROSS-REFERENCE TO RELATED APPLICATION(S)

This application claims priority to U.S. Provisional Patent Application Ser. No. 60/135,010 filed May 20, 1999.

FIELD OF THE INVENTION

The invention relates to SMT printing processes where the life (usage limits) of squeegee blades and/or a printing head can be monitored.

BACKGROUND OF THE INVENTION

Description of The Relevant Art

When using squeegee blades or a printing head for the application of solder paste, there are times when these components are removed from machines for cleaning and the like and installed in the same or different machines. As with any mechanical components, there are limits regarding the effective life of these components. Currently in SMT, there is no easy way for a user to know when a squeegee blade or print head is good or bad other than the subjective criteria, such as visual inspection.

It is well known that there are many monitoring systems for machines that can display information, such as the number of SMT boards printed, total hours of usage of the machines, etc. For example, a particular squeegee blade may have a designed life of 40,000 cycles. However, none of this information actually indicates the usage of an individual squeegee blade or print head.

SUMMARY OF THE INVENTION

With the present invention, a user can set an indicator to zero when a new squeegee blade or print head is installed. The users can then check a counter display every time a squeegee blade is put into use and when the counter display reaches a predetermined number, e.g. 40,000, the user would replace the squeegee blade or print head.

The invention takes a measurement device, a counter, and places it directly near the item of interest, the squeegee blade or print head. The counter remains on at all times thereby displaying of the usage of the squeegee blade or print head without the difficulties of looking in log books or turning on computers to see usage information.

The invention in one aspect counts and displays the number of times a squeegee blade is used based on the relative movement between opposed squeegee blade holders. Each squeegee blade holder includes an actuator and a sensor/display. The actuator of one holder communicates with the sensor of the other holder. During operation of a squeegee system when one holder moves the associated squeegee blade to and from a print stroke position the other holder moves its associated blade from and to a non-print stroke position. During the relative motion the actuator is aligned with a actuator/sensor/display.

The invention, in another aspect, counts and displays the number of times the blades of a printing head are used. An actuator is secured to the head in communication with a sensor/display also secured to the head. Each time the head moves and engages the stencil the sensor is actuated.

DESCRIPTION OF THE PREFERRED EMBODIMENTS(S)

Squeegee systems for solder paste applications using squeegee blades in SMT are well known in the art. The disclosed invention can be fully understood without a detailed description of a squeegee system.

Figure 1:
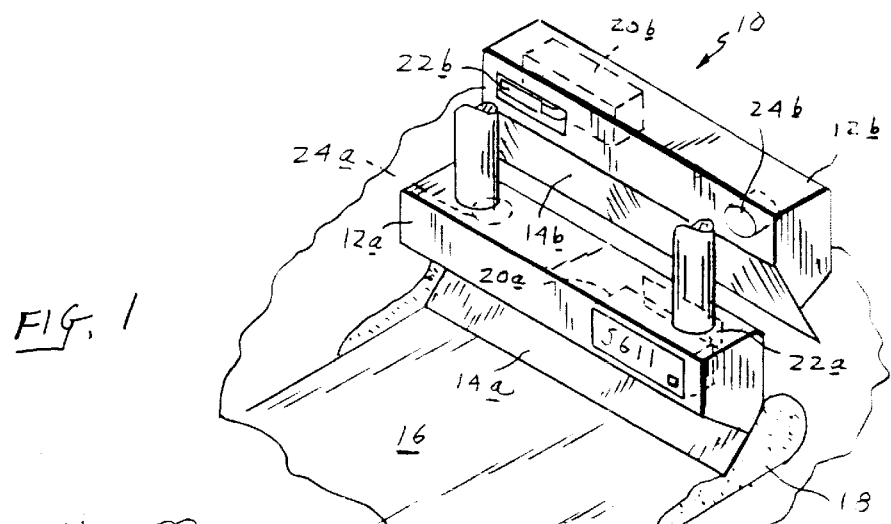
FIG. 1 is a schematic illustration of a counter embodied in a squeegee head.

A preferred embodiment of the invention is shown generally in FIG. 1 at 10 and comprises squeegee blade holders 12a and 12b with associated squeegee blades 14a and 14b. As is well understood, if the blade 14a is engaged to a stencil 16 and is in a print mode to apply a solder paste 18 to the stencil 16, it moves across the stencil 16 while the squeegee blade 14b is raised relative to the blade 14a to avoid binding with the stencil. Subsequently, the movement is reversed and the blade 14b engages the stencil 16 while the blade 14a is moved to a non-binding angle of attack.

As shown in FIG. 1, the relative movement between the squeegee blades 14 and thereby the holders is essentially a vertical movement. Although described in this embodiment with reference to relative vertical movement between the squeegee blade holders 12, the squeegee blade holders 12 can also have other forms of relative movement one to the other such as by tilting.

Secured within each holder 12a and 12b are electrically responsive digital counters 20a and 20b respectively. Associated with the counters 20a and 20b are sensors comprised of reed switches 22a and 22b. Also secured within the holders 12a and 12b are actuators comprised of magnets 24a and 24b which actuate the reed switches 22b and 22a respectively. In an alternative embodiment, the sensors can also comprise sensors capable of detecting light and the actuators can also comprise actuators capable of generating light.

Figure 2A:
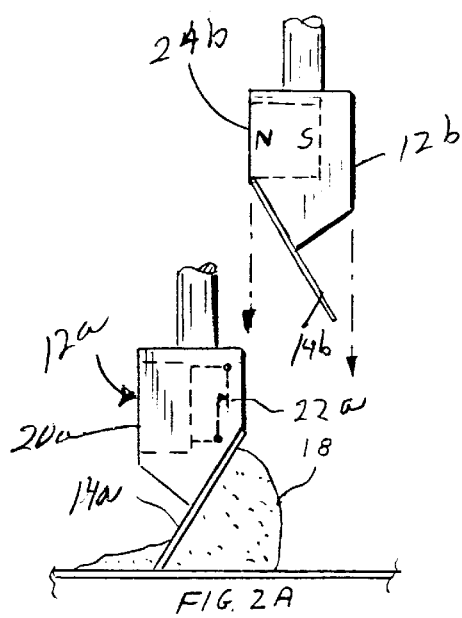
FIGS. 2a and 2b illustrate the actuation of a counter.

Referring to FIG. 2a, the actuator 24b is not in communication with the reed switch 22a. When there is relative movement between the actuator 24b and the reed switch 22a, the reed switch 22a is actuated reflecting a count displayed in the counter 20a. This is shown most clearly in FIG. 2b.

The counters 20 remain on at all times thereby giving a display of the usage of the squeegee blades 14 without the difficulties of looking into log books or turning on computers. As shown, for each cycle of each squeegee, both squeegees experience one trigger because of the passing magnetic arrangement. An electric circuit (not shown) divides by two to give the true count on each squeegee.

Although it is preferred not to use a direct contact switch, e.g. mechanical engagement, it is within the scope of the invention as well as using optical sensors.

This invention allows users to achieve better quality in their production by knowing at all times the use accumulated on their squeegee blades, thereby enabling the users to avoid having a bad squeegee create many defects and trouble on the production line. By following the count on the display, the users can understand the life of the squeegee and replace it before it causes problems. This disclosed invention enables advanced production lines to improve their quality and maintenance programs.

Figure 2B:
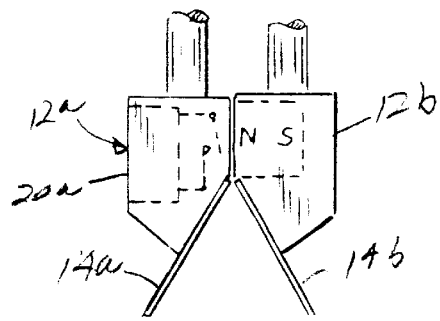

As shown in FIG. 2b, each time each squeegee holder comes down, the movement of the magnet 24 with the opposing reed switch 22 causes one "trigger pulse" to be input to the counter 20 on each squeegee holder 12. So one squeegee 12 down-stroke causes a trigger on that squeegee, and on the other squeegee which is not in use. Therefore, there is a circuit (not shown) to divide the switch counts by two, so the counter sees the actual number of cycles the individual squeegee endures. The circuit which divides by two the number of switch inputs is readily known to those skilled in the art. The counter and circuit are powdered by a standard lithium 3 v battery, such as available from Energizer, part number ECR2032. The battery, counter, circuit and magnetic switch are all integrated into the body of the squeegee holder and are sealed from contamination by solvents or solder paste.

Figure 3:
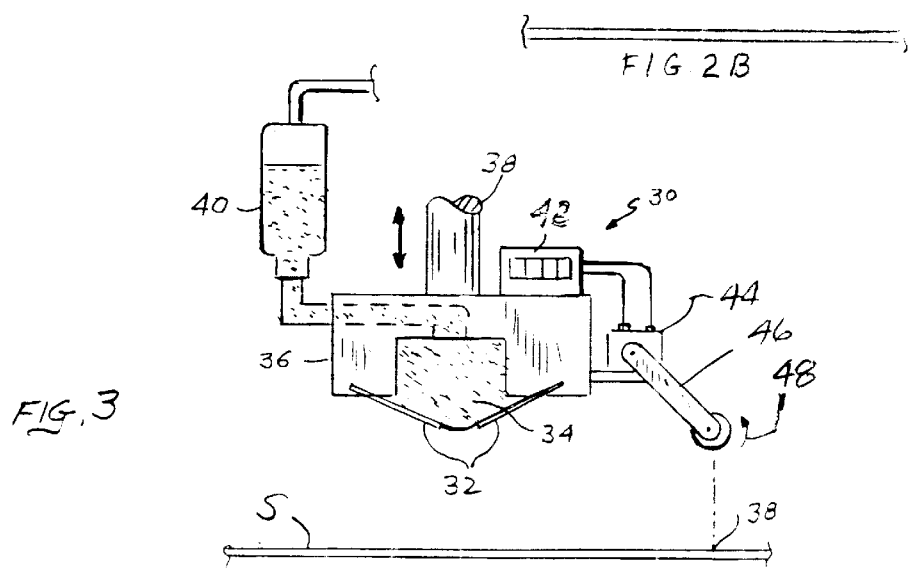
FIG. 3 is a schematic illustration of an alternative embodiment of the invention.

In another embodiment of the invention, referring to FIG. 3, a squeegee printing head 30 is shown having squeegee blades 32 are facing inwardly such as in a MPM Rheometric Pump Head system or a DEK Pro-Flow printing head. In these systems, the solder paste 34 is contained in a closed chamber 36 and both blades 32 and the chamber 36 are brought down together to make contact with the stencil surface 38 to make a print. This type of printing is referred to as "cartridge printing". The housing 36 is actuated up and down as shown by the arrow, and is moved along in a linear direction by a squeegee drive head (not shown), which is attached by way of structural drive rod (not shown). In cartridge printing, a supply of solder paste, such as the syringe shown at 40 is used. The counter in this embodiment can also be used to indicate when the solder 34 is running low.

An electronic counter 42 is instrumented to the squeegee printing head 30. To trigger the counter a contact switch 44 is used instead of opposing magnets. Alternatively, a single magnet could be positioned on a fixed location on the printer drive head, and when the cartridge head moves this triggers the counter. A contact switch 44 with a lever arm 46 makes contact with a stencil S at point 38 each time the squeegee head 36 is operated to print The switch 44 actuates the counter 42.

The invention also may be used to determine the exact distance of travel of a squeegee or squeegee head. A roller 48 can send a signal of the amount of revolutions it experiences while down against the stencil surface. In this mode, the counter would be measuring "pulses" from the roller, and the roller would have an optical encoder. Such rotary sensing is well known in the industry and the details of that are not part of this invention.

The invention is an advantage in cartridge printing applications for the same reasons as dual squeegee printing, namely it is now possible to track very accurately the exact number of cycles experienced by a cartridge, so as to insure the blades and other parts which are subject to wear are within their operating cycle range.

The foregoing description has been limited to a specific embodiment of the invention. It will be apparent, however, that variations and modifications can be made to the invention, with the attainment of some or all of the advantages of the invention. Therefore, it is the object of the appended claims to cover all such variations and modifications as come within the true spirit and scope of the invention.

Having described my invention, what I now claim is:

1. In a squeegee blade system having a pair of squeegee blade holders, each holder having a squeegee blade secured thereto and where one squeegee blade moves to and from a print stroke position and the other holder moves its associated blade from and to a non-print stroke position, the improvement which comprises:

a first actuator secured to one of the squeegee blade holders and a second actuator secured to the other of the squeegee blade holders;

a first sensor/display secured to one squeegee blade holder and a second sensor/display secured to the other squeegee blade holder;

means for moving one squeegee blade holder with reference to the other squeegee blade holder;

the first actuator adapted to communicate with the second sensor/display, the second actuator adapted to communicate with the first sensor/display whereby as the squeegee blades move between their relative positions, the sensor is actuated and displays the number of times the squeegee has been used in the print stroke position.

2. The improvement of claim 1 wherein the actuator comprises a magnet.

3. The improvement of claim 2 wherein the sensor comprises a reed switch.

4. The improvement of claim 3 wherein the squeegee blade system further comprises a counter and circuit in communication with the reed switch.

5. The improvement of claim 1 wherein the actuator is capable of generating light.

6. The improvement of claim 5 wherein the sensor is capable of detecting light.

7. In a squeegee blade system wherein there is a squeegee head having a pair of mirror image squeegee blades secured thereto which head moves to and from a stencil, the improvement which comprises:

a sensor secured to the squeegee head;

means for counting secured to the squeegee head and in communication with the sensor: and an actuator in communication with the sensor which actuator signals the sensor each time the squeegee head moves to the stencil.

8. The improvement of claim 7 wherein the sensor is comprised of a contact switch.

9. The improvement of claim 7 wherein the actuator is comprised of a magnet.

10. The improvement of claim 9 wherein the sensor comprises a reed switch.

11. The improvement of claim 7 wherein the actuator is capable of generating light.

12. The improvement of claim 11 wherein the sensor is capable of detecting light.

13. In a squeegee blade system wherein there is a squeegee head having a pair of mirror image squeegee blades secured thereto which head moves to and from a stencil and an arm attached to the head having a roller secured thereto which roller travels across the stencil when the head moves to the stencil, the improvement which comprises:

a first sensor secured to the squeegee head and optionally a second sensor secured to the squeegee head;

means for measuring secured to the squeegee head and in communication with the first sensor and optionally means for counting secured to the squeegee head and in communication with the second sensor; and a first actuator in communication with the roller which actuator signals the first sensor each time the roller travels across the stencil and optionally a second actuator in communication with the second sensor which second actuator signals the second sensor each time the squeegee head moves to the stencil.

14. The improvement of claim 13 wherein the first actuator comprises an optical encoder.

15. The improvement of claim 13 wherein the second sensor is comprised of a contact switch.

16. The improvement of claim 13 wherein the second actuator is comprised of a magnet.

17. The improvement of claim 16 wherein the second sensor comprises a reed switch.

18. The improvement of claim 13 wherein the second actuator is capable of generating light.

19. The improvement of claim 18 wherein the sensor is capable of detecting light.

* * * * *